US012628319B2

(12) United States Patent
Lorenz et al.

(10) Patent No.: US 12,628,319 B2
(45) Date of Patent: May 12, 2026

(54) COOLING FIN ARRANGEMENT OF A COOLER, THROUGH WHICH FLUID CAN FLOW, FOR COOLING POWER ELECTRONICS

(71) Applicant: Robert Bosch GmbH, Stuttgart (DE)

(72) Inventors: Marco Lorenz, Ditzingen (DE); Maik Paehrisch, Reutlingen (DE); Max Florian Beck, Vaihingen An der Enz (DE)

(73) Assignee: Robert Bosch GmbH, Stuttgart (DE)

( * ) Notice: Subject to any disclaimer, the term of this patent is extended or adjusted under 35 U.S.C. 154(b) by 123 days.

(21) Appl. No.: 18/687,563

(22) PCT Filed: Jul. 29, 2022

(86) PCT No.: PCT/EP2022/071349
§ 371 (c)(1),
(2) Date: Feb. 28, 2024

(87) PCT Pub. No.: WO2023/030790
PCT Pub. Date: Mar. 9, 2023

(65) Prior Publication Data
US 2024/0381591 A1     Nov. 14, 2024

(30) Foreign Application Priority Data
Aug. 30, 2021    (DE) ..................... 10 2021 209 504.6

(51) Int. Cl.
*H05K 7/20*          (2006.01)
*F28F 3/02*          (2006.01)
(52) U.S. Cl.
CPC ......... *H05K 7/209* (2013.01); *H05K 7/20436* (2013.01); *F28F 3/027* (2013.01)

(58) Field of Classification Search
CPC ..... H05K 7/209; H05K 7/20436; F28F 3/027; F28F 3/025; F28F 3/046
(Continued)

(56) References Cited

U.S. PATENT DOCUMENTS 6,273,183 B1 *  8/2001  So ......................... F28D 1/0333
                                                          165/152
7,255,159 B2 *  8/2007  Sagasser ................. F28D 9/005
                                                          165/146
(Continued)

FOREIGN PATENT DOCUMENTS

JP        H0282561 A      3/1990
JP        2006080226 A    3/2006
(Continued)

OTHER PUBLICATIONS

Translation of International Search Report for Application No. PCT/EP2022/071349 dated Dec. 8, 2022 (2 pages).

*Primary Examiner* — Claire E Rojohn, III
(74) *Attorney, Agent, or Firm* — Michael Best & Friedrich LLP

(57) ABSTRACT

The present invention relates to a cooling fin arrangement (1) of a cooler, through which fluid can flow, for cooling power electronics (200). The cooling fin arrangement (1) comprises at least one cooling fin (10), which is formed from a wave profile that periodically repeats in a direction of repetition (501), the direction of repetition (501) being perpendicular to a flow direction (500). The invention also relates to a cooler, through which fluid can flow, for cooling power electronics (200), the cooler comprising a cooling fin arrangement (1) of this type, and to a power electronic assembly (1000), comprising power electronics (200) and a cooler (100) of this type, through which fluid can flow.

16 Claims, 8 Drawing Sheets

(58) Field of Classification Search
  USPC .................. 165/80.4, 151, 181, 182, 185
  See application file for complete search history.

(56) References Cited

U.S. PATENT DOCUMENTS

| | | | | |
|---|---|---|---|---|
| 8,261,816 | B2 * | 9/2012 | Ambros | F28D 9/0031 |
| | | | | 165/173 |
| 10,107,553 | B2 * | 10/2018 | Takagi | F28D 1/05325 |
| 10,436,156 | B2 * | 10/2019 | Hoepfner | F02B 29/0475 |
| 10,605,543 | B2 * | 3/2020 | Schnabel | F28F 3/022 |
| 11,162,742 | B2 * | 11/2021 | Hoepfner | F28F 1/128 |
| 11,454,448 | B2 * | 9/2022 | Fukada | F28F 3/027 |
| 12,546,540 | B2 * | 2/2026 | Shin | F28D 9/0037 |
| 2005/0217825 | A1 * | 10/2005 | Chern | H10W 40/43 |
| | | | | 165/185 |
| 2008/0047696 | A1 * | 2/2008 | Sperandei | F28F 3/027 |
| | | | | 165/177 |
| 2010/0276135 | A1 | 11/2010 | Morino et al. | |
| 2014/0060789 | A1 * | 3/2014 | Rousseau | F28F 3/025 |
| | | | | 165/166 |
| 2024/0381567 | A1 * | 11/2024 | Paehrisch | H05K 7/20254 |
| 2024/0381569 | A1 * | 11/2024 | Paehrisch | H05K 7/20927 |
| 2024/0381591 | A1 * | 11/2024 | Lorenz | H05K 7/209 |
| 2024/0414880 | A1 * | 12/2024 | Lorenz | H05K 7/20927 |
| 2025/0280509 | A1 * | 9/2025 | Jatzek | H05K 7/20272 |
| 2025/0331126 | A1 * | 10/2025 | Paehrisch | H05K 7/20145 |
| 2025/0331139 | A1 * | 10/2025 | Beck | H05K 7/20927 |

FOREIGN PATENT DOCUMENTS

| | | | |
|---|---|---|---|
| JP | 2011129823 A | 6/2011 |
| JP | 2015227770 A | 12/2015 |
| WO | 2006118031 A1 | 11/2006 |

* cited by examiner

B - B

A - A

COOLING FIN ARRANGEMENT OF A COOLER, THROUGH WHICH FLUID CAN FLOW, FOR COOLING POWER ELECTRONICS

BACKGROUND

The present invention relates to a cooling fin arrangement of a cooler through which fluid can flow, for cooling power electronics. In particular, the invention relates to a cooling fin arrangement that enables optimized cooling of power electronics. Furthermore, the invention relates to a cooler through which fluid can flow, having at least one such cooling fin arrangement, and to an arrangement comprising power electronics and such a cooler.

Power semiconductors in power electronics carry high electrical currents. Together with switching losses, the resulting conduction losses are the cause of a high heat loss, which must be dissipated over a very small area. The maximum permissible semiconductor temperature is critical to failure, which is why minimizing the thermal resistance between the semiconductor and the coolant is of central importance. For efficient cooling, the power substrates are applied to coolers through which fluid can flow. These coolers are made of aluminum, AlSiC or copper alloys. Pins or fins are arranged inside the cooler to increase the heat transfer surface and intensify the heat transfer. In order to achieve low thermal resistance between a power substrate, in particular an AMB/DBC power substrate (AMB: active metal braze; DBC: direct copper bonding), and the cooler, the power substrate is joined to the cooler by means of a soft soldering process or, optionally, a sintering process. For this purpose, these coolers may be surface-coated with materials suitable for a soft soldering process or a sintering process. In automotive engineering, aluminum coolers, also known as AlSiC or copper coolers, which consist of several components that are joined in particular by a brazing process, are frequently used.

Often, fins made of punched sheet metal are used in coolers through which fluid can flow. Existing fin geometries do not meet the requirements of a cooler through which fluid can flow, for cooling power electronics. The thermal performance is essentially determined by the heat transfer between the fluid and the fin surface, the fin surface and the fin efficiency.

SUMMARY

The advantage of the cooling fin arrangement of a cooler through which fluid can flow, for cooling power electronics according to the invention is that it enables optimum cooling of the power electronics. In particular, the cooling fin arrangement can achieve a good ratio between the thermal performance of the cooling fin arrangement and the pressure loss caused in the cooler. The cooling fin arrangement according to the invention is therefore particularly suitable for use in coolers through which fluid can flow, for high-performance electronic applications. This is achieved in that the cooling fin arrangement of a cooler through which fluid can flow, for cooling power electronics comprises at least one cooling fin which is formed from a wave profile that periodically repeats in a direction of repetition, the direction of repetition being perpendicular to a flow direction. The flow direction corresponds in particular to a main flow direction of a coolant used as a coolant, which flows through openings formed by the at least one cooling fin. In particular, the main flow direction is the direction in which the fluid mainly flows, i.e., the direction in which a velocity component of the fluid is greater than a velocity component of the fluid in a direction parallel to the direction of repetition. The main flow direction preferably corresponds to the direction in which the fluid is introduced into a cooler through which fluid can flow. The direction of repetition corresponds in particular to a width direction of the cooler. It should be noted that the term "wave profile" refers to any profile that has a cross-section in the shape of a wave, wherein the wave can have any shape as long as it includes a region with maximum height and a region with minimum height. In particular, this means that the shaft does not necessarily have to be designed as a curve, but can only comprise straight sections or a combination of curved and straight sections. It should also be noted that, in the context of the invention, the term "profile" refers in particular to an element, especially a sheet-shaped element, whose cross-section is constant over its entire length. The direction of the length of the profile can be referred to as the longitudinal direction or extension direction of the profile. This means that, in the context of the invention, the wave profile of the at least one cooling fin is repeated in the direction of repetition and extends in the direction of extension. It is to be understood that by forming the cooling fin from a wave profile that periodically repeats, the at least one cooling fin as such is formed as a wave profile, which has a cross-section which is formed from the individual cross-sections of the aforementioned repeating wave profile. In the context of the invention, the at least one cooling fin can thus be referred to in particular as a cooling fin wave profile in order to indicate that the cooling fin as a unit is designed as a wave profile. By designing the at least one cooling fin as a repeating profile, the cooling fin serves as a surface-enlarging, flow-guiding and heat-transfer-enhancing structure, wherein increased heat dissipation and thus also improved cooling of power electronics can be achieved. The at least one cooling fin can preferably be produced in a stamping and/or roll forming process for ideal surface utilization with maximum fin efficiency.

Preferably, the wave profile is repeated an integer or non-integer number of times. This means that for an integer number of repetitions of the wave profile, the cooling fin corresponds to an integer multiple of the wave profile that periodically repeats. On the other hand, a non-integer number of times means that the cooling fin is not an integer multiple of the periodically repeating wave profile. How many times the wave profile is repeated depends advantageously on the width of the power electronics, in particular a power electronics unit, which is to be cooled by a cooler comprising the cooling fin arrangement.

Preferably, a cross-section of the at least one cooling fin has the shape of a meander. In the context of the invention, a meander is in particular a shaft comprising rectilinear or essentially rectilinear sections that are perpendicular or essentially perpendicular to one another. In other words, the sections are arranged relative to each other in such a way that right-angled or essentially right-angled deflections are formed between adjacent or directly connected sections. The phrase "essentially perpendicular" means in particular a deviation of no more than 10 degrees, preferably no more than 8 degrees, from the perpendicular position.

The at least one cooling fin is preferably made of a material and/or coated with a material that has a thermal conductivity coefficient that is greater than 200 W/(m-K). Advantageously, the at least one cooling fin can be made of aluminum or coated with aluminum.

According to an advantageous embodiment of the invention, the at least one cooling fin can comprise a plurality of cooling fins. In other words, according to the alternative advantageous embodiment of the invention, the cooling fin arrangement may comprise a plurality of cooling fins. The cooling fins are formed from wave profiles that repeat periodically in a direction of repetition, in particular with the same period, and are arranged parallel to each other. This defines rows of cooling fins, each of which is formed from a wave profile that periodically repeats. The wave profiles are preferably repeated with the same period. The parallel arrangement of the cooling fins next to each other means in particular that the cooling fins are arranged parallel to each other in the flow direction. The design of the cooling fin arrangement with a plurality of cooling fins has the advantage that the cooling fins can be individually designed and/or arranged relative to each other in such a way that, in particular depending on the application, heat dissipation can be increased and/or a pressure loss caused by the cooling fins of a fluid used as a coolant can be reduced. In particular, this can optimize the ratio of heat dissipation achieved by means of the cooling fins to the pressure loss caused. It should be noted that cooling fins arranged directly next to one another are referred to in particular as adjacent cooling fins in the context of the invention.

A sum of the dimensions of the cooling fins in a direction perpendicular to the direction of repetition corresponds to the corresponding dimension of a cooling channel of the cooler and/or the corresponding dimension of a power electronics unit. In other words, a sum of the dimensions of the cooling fins in a direction perpendicular to the direction of repetition is adapted to a corresponding dimension of the cooling channel of the cooler and/or a power electronics unit.

Preferably, the repeating wave profile of at least one cooling fin, preferably each cooling fin, is offset in the direction of repetition from the repeating wave profile of an adjacent cooling fin. This means that the cooling fins are offset to each other in the direction of repetition. This allows the flow of a fluid used as a coolant through the cooling fins to be adjusted in such a way that increased heat transfer takes place. In particular, the arrangement of the cooling fins relative to each other can be selected in such a way that a longer fluid path is achieved and/or a turbulent flow of the fluid is created. In contrast to a laminar flow, which only transfers heat by conduction, a turbulent flow transports heat by both conduction and convection, which significantly increases cooling efficiency.

Preferably, the offset between repeating wave profiles of adjacent cooling fins in the direction of repetition is between 0.8×t/4 and 1.2×t/4. Here, "t" corresponds to a pitch of the cooling fins. The pitch of the cooling fins corresponds to the period with which the wave profiles of the cooling fins, which periodically repeat, are repeated to form the cooling fins. It should be understood that the phrase "in the direction of repetition" refers to the offset and not to the adjacent cooling fins. The pitch is specified in a length dimension.

Preferably, the repeating wave profiles of the cooling fins alternately have a first position in the direction of repetition and a second position in the direction of repetition. It should be understood that the first position is constant for all relevant cooling fins, wherein the second position is also constant for all relevant cooling fins. It should also be understood that the first position and the second position are offset from each other in the direction of repetition. An offset between the first position and the second position corresponds to the offset described above between the repeating wave profiles of neighboring cooling fins in the direction of repetition.

According to a first advantageous embodiment of the invention, a region of the repeating wave profile of at least one cooling fin, preferably of each cooling fin, is set at an angle, preferably at one and the same angle, to a direction perpendicular to the direction of repetition. The region of the repeating wave profile of at least one cooling fin, preferably each cooling fin, advantageously comprises at least one leg, in particular two legs, of the wave profile. This means that the leg(s) of the wave profile, in particular its/their surfaces, are at an angle to a direction perpendicular to the direction of repetition.

It should be noted that in the context of the invention, the phrases "set at an angle", "stands at an angle" or the like mean that the corresponding angle cannot be zero.

According to a second advantageous embodiment of the invention, a region of the repeating wave profile of at least one cooling fin is set at a first angle and a region of the repeating wave profile of at least one cooling fin is set at a second angle to a direction perpendicular to the direction of repetition. Particularly preferably, a region of the repeating wave profiles of the cooling fins (of the plurality of cooling fins) is alternately set at a first angle and a second angle to the direction perpendicular to the direction of repetition.

Advantageously, the first angle is positive and the second angle is negative. A positive angle to the direction perpendicular to the direction of repetition corresponds to an angle measured counterclockwise from a line running in the direction perpendicular to the direction of repetition. Accordingly, a negative angle to the direction perpendicular to the direction of repetition is an angle measured clockwise from a line running in the direction perpendicular to the direction of repetition.

Preferably, in the second advantageous embodiment of the invention, the first angle and the second angle can have the same amount.

Preferably, in the second advantageous embodiment of the invention, an amount of the first angle and/or the second angle is between 5 degrees and 25 degrees, preferably between 9 degrees and 21 degrees.

Preferably, in the second advantageous embodiment of the invention, a height of at least one cooling fin, in particular of each cooling fin, is between 2.5 mm and 3.5 mm, preferably between 2.9 mm and 3.1 mm.

In the second advantageous embodiment of the invention, a pitch of at least one cooling fin, in particular of each cooling fin, is preferably between 4 mm and 5 mm, preferably between 4.3 mm and 4.7 mm.

Preferably, in the second advantageous embodiment of the invention, a dimension of at least one cooling fin, in particular of each cooling fin, in a direction perpendicular to the direction of repetition is between 1.5 mm and 2.1 mm, preferably between 1.7 mm and 1.9 mm.

In the second advantageous embodiment of the invention, a profile thickness of at least one cooling fin, in particular of each cooling fin, is preferably between 0.2 mm and 0.45 mm, preferably 0.3 mm.

Preferably, in the second advantageous embodiment of the invention, a form inclination of at least one cooling fin, in particular of each cooling fin, is between 3 degrees and 8 degrees.

According to a third advantageous embodiment of the invention, at least one cooling fin, preferably each cooling fin, extends perpendicular to the direction of repetition. In particular, this means that a region of the repeating wave profile extends parallel to the direction perpendicular to the direction of repetition.

The height of at least one cooling fin, in particular each cooling fin, can preferably be between 2.5 mm and 3.5 mm, preferably between 3 mm and 3.2 mm.

In the third advantageous embodiment of the invention, a pitch of at least one cooling fin, in particular of each cooling fin, can preferably be between 2 mm and 4 mm, preferably between 2.5 mm and 3.5 mm.

Preferably, in the third advantageous embodiment of the invention, a dimension of at least one cooling fin, in particular of each cooling fin, in a direction perpendicular to the direction of repetition can be between 3.1 mm and 4.1 mm, preferably between 3.5 mm and 3.7 mm.

Preferably, in the third advantageous embodiment of the invention, a profile thickness of at least one cooling fin, in particular of each cooling fin, can be between 0.2 mm and 0.45 mm, preferably 0.3 mm.

Preferably, in the third advantageous embodiment of the invention, a form inclination of at least one cooling fin, in particular of each cooling fin, can be between 3 degrees and 8 degrees.

Furthermore, the present invention relates to a cooler through which fluid can flow for cooling power electronics, which comprises a cooling fin arrangement as described above.

Preferably, the cooler through which fluid can flow comprises a housing. The housing can preferably be made of at least two metal parts, in particular aluminum parts, which are connected to each other and define a cooling channel. The cooling channel corresponds in particular to an interior of the housing.

In an advantageous way, the cooling fin arrangement is arranged in the cooling channel of the cooler through which fluid can flow.

Further preferably, an inlet and an outlet for a fluid used as a coolant are arranged directly on the housing.

Preferably, the cooling fin arrangement can comprise at least a first group of cooling fins and a second group of cooling fins. In other words, the plurality of cooling fins is divided into a first group of cooling fins and a second group of cooling fins. A cooler with such a cooling fin arrangement can advantageously be used to cool power electronics comprising two power electronics units. Advantageously, the first group of cooling fins is assigned to a first power electronics unit and the second group of cooling fins is assigned to a second power electronics unit. The first group of cooling fins thus serves to cool the first power electronics unit, while the second group of cooling fins serves to cool the second power electronics unit. It should be understood that the first power electronics unit and the second power electronics unit are separate power electronics units.

Furthermore, the cooling fin arrangement can also preferably have a third group of cooling fins. This means that a plurality of cooling fins are divided into the first group of cooling fins, the second group of cooling fins and the third group of cooling fins. A cooler with such a cooling fin arrangement can advantageously be used to cool power electronics comprising three power electronics units. Advantageously, the first group of cooling fins is assigned to a first power electronics unit, the second group of cooling fins to a second power electronics unit and the third group of cooling fins to a third power electronics unit. Thus, the first group of cooling fins is used to cool the first power electronics unit, the second group of cooling fins is used to cool the second power electronics unit and the third group of cooling fins is used to cool the third power electronics unit. It should be understood that the first power electronics unit, the second power electronics unit and the third power electronics unit are separate power electronics units.

Preferably, the first group of cooling fins and the second group of cooling fins are designed such that the temperature of at least one power semiconductor of the power electronics unit assigned to the first group of cooling fins is equal to the temperature of at least one power semiconductor of the power electronics unit assigned to the second group of cooling fins. Accordingly, in a cooler whose cooling fin arrangement comprises three cooling fin groups, the cooling fin groups are preferably designed in such a way that the power electronics units assigned to the first cooling fin group, those assigned to the second cooling fin group and those assigned to the third cooling fin group have the same temperatures in the corresponding power semiconductors. The temperature of a respective power semiconductor should advantageously be understood as a junction temperature at steady-state heat losses.

The cooling fins of the first group of cooling fins, the second group of cooling fins and/or the third group of cooling fins preferably differ from one another in of the third cooling fin group differ from one another by the shape of a cross-section of the respective wave profile and/or the number of cooling fins and/or the offset between adjacent cooling fins and/or the height of the cooling fins and/or the profile thickness of the cooling fins and/or the form inclination of the cooling fins and/or the dimension of the cooling fins in the direction perpendicular to the direction of repetition and/or the orientation of the region of the profiles that periodically repeat, with respect to the direction perpendicular to the direction of repetition and/or the pitch of the wave profiles that periodically repeat.

Preferably, the cooling fins are designed according to the second advantageous configuration and the angles or the orientation of the profiles that periodically repeat, with respect to the direction perpendicular to the direction of repetition of each cooling fin group have the same amount in each case, the first coolant group preferably having an angle of 10 degrees, the second an angle of 15 degrees and, if applicable, the third coolant group an angle of 20 degrees.

The first group of cooling fins is preferably arranged upstream of the second cooling fin arrangement in the main flow direction of the fluid used as a coolant. In a cooler whose cooling fin arrangement comprises a third cooling fin group in addition to the first and second cooling fin groups, the third cooling fin group is preferably arranged downstream of the second cooling fin arrangement in the main flow direction of the fluid used as coolant. This means that the fluid first passes through the first group of cooling fins, then through the second group of cooling fins and finally through the third group of cooling fins.

Preferably, the cooling fin arrangement is manufactured in one piece. In an advantageous way, all cooling fins of the cooling fin arrangement are formed from a single part (sheet metal).

Furthermore, the present invention relates to a power electronics arrangement comprising a cooler through which fluid can flow as described above and power electronics. The power electronics are located on the cooler. This means that the power electronics can be cooled by the cooler. In particular, the power electronics are fixed to the cooler.

Preferably, the power electronics can comprise one power electronics unit or several power electronics units. The power electronics units can be arranged on one or both sides of the cooler through which fluid can flow, or its housing. In other words, the cooler through which the fluid flows can be fitted with power electronics units on one or both sides.

The power electronics can preferably comprise at least a first power electronics unit and a second power electronics unit. In the main flow direction of the fluid used as coolant, the first power electronics unit is preferably arranged upstream of the second power electronics unit. Furthermore, the power electronics can preferably comprise a third power electronics unit. The third power electronics unit is preferably arranged downstream of the second power electronics unit in the main flow direction of the fluid.

In the context of the invention, a power electronics unit may in particular also be referred to as a power module. The power electronics unit preferably comprises a printed circuit board and/or conductor tracks and/or one or more power semiconductors.

BRIEF DESCRIPTION OF THE DRAWINGS

In the following, exemplary embodiments of the invention are described in detail with reference to the accompanying drawing, wherein identical or functionally identical components are designated by the same reference signs. The drawings show the following.

DETAILED DESCRIPTION

With reference to FIGS. 1 through 5, a power electronics arrangement 1000 according to the invention with power electronics 200 and a cooler 100 according to a first exemplary embodiment of the invention is described below.

Figure 1:
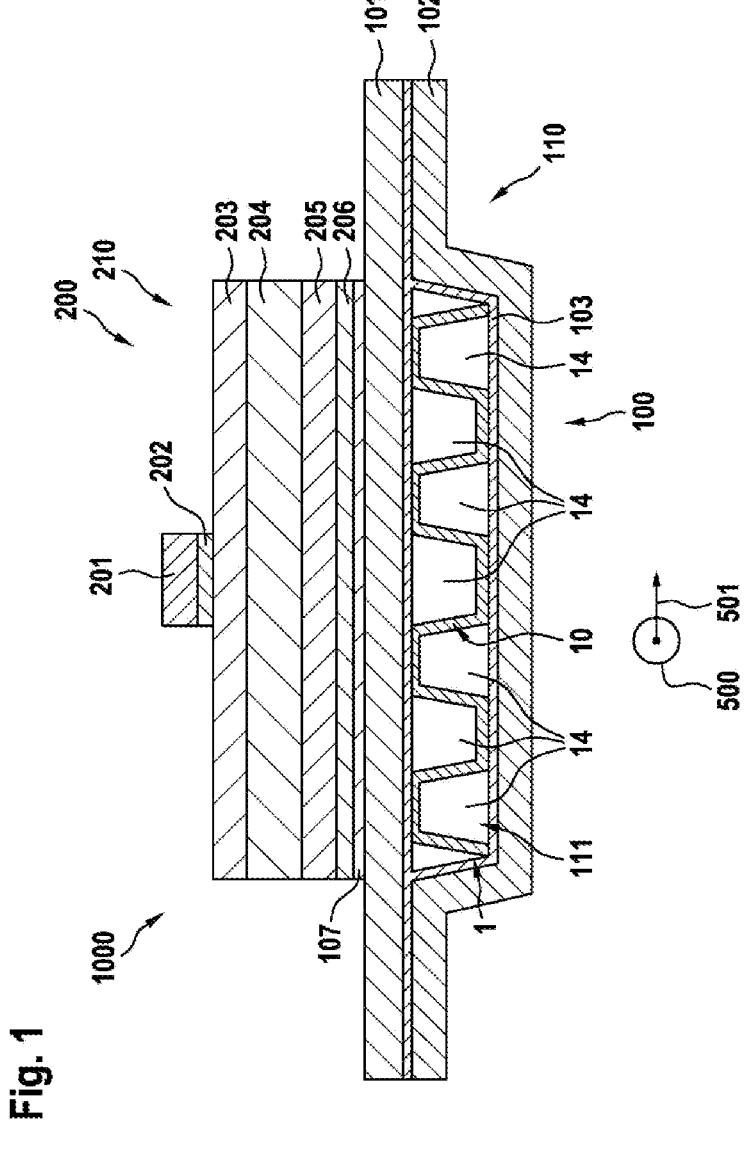
FIG. 1 a schematic simplified sectional view of a power electronics arrangement according to the invention with power electronics and a cooler through which fluid can flow and which has a cooling fin arrangement according to a first exemplary embodiment of the invention, FIG. 2 a schematic top view of a region of the cooler through which fluid can flow, from FIG. 1, FIG. 3 a schematic perspective view of a sub-region of the region of the cooler through which fluid can flow, from FIG. 2, FIG. 4 a schematic sectional view of the region of the cooler through which fluid can flow, from FIG. 2, FIG. 5 another schematic sectional view of a sub-region of the region of the cooler through which fluid can flow, from FIG. 2, FIG. 6 a schematic perspective view of a cooling fin arrangement according to a second exemplary embodiment of the present invention, FIG. 7 a schematic simplified sectional view of a power electronics arrangement according to a third exemplary embodiment of the present invention, FIG. 8 a schematic simplified sectional view of a power electronics arrangement according to a fourth exemplary embodiment of the present invention, and FIG. 9 a schematic simplified sectional view of a power electronics arrangement according to a fifth exemplary embodiment of the present invention.

As can be seen from FIG. 1, the power electronics 200 comprises a power electronics unit 210, which can also be referred to as a power module. The power electronics unit 210 has a printed circuit board 204, conductor tracks 203, 205 and power semiconductors 201. The conductor tracks 203, 205 are designed in particular as copper conductor tracks, with the printed circuit board 204 preferably being made of ceramic.

The power semiconductors 201 are applied to the conductor track 203 by means of a layer 202. In particular, the layer 202 is designed as a solder or sintered layer.

The conductor tracks 203, 205 together with the printed circuit board 204 form a power substrate. The power substrate is joined to the cooler 100, in particular to a first metal part 101 of a housing 110 of the cooler 100, by means of a layer 206 produced by a soft soldering process or a sintering process, which is thus correspondingly a soft soldering layer or sintering layer.

The housing 110 of the cooler 100 further comprises a second metal part 102, which is connected to the first metal part 101 by means of a layer 103, which is formed in particular as a brazing layer. Both the first metal part 101 and the second metal part 102 are preferably aluminum parts.

FIG. 1 also shows that the first metal part 101 is an upper part and the second metal part 102 is a lower part of the housing 110. The first metal part 101 faces the power electronics unit 210, with the second metal part 102 facing away from the power electronics unit 210. Furthermore, in this exemplary embodiment, the first metal part 101 is plate-shaped, with the second metal part 102 having a plate-shaped region and a region that is trapezoidal in cross-section. However, it is also possible for the first metal part 101 and the second metal part 102 to have other shapes. The second metal part 102 can advantageously be produced by a deep-drawing process.

Between the layer 206 and the cooler 100, in particular the first metal part 101, there is advantageously a mediating layer 107, which is firmly connected to the first metal part 101 and allows wetting of the layer 206. The mediating layer 107 is an optional feature of the power electronics arrangement 1000 and may in particular be considered either as a separate part or as part of the housing 110 of the cooler 100.

The first metal part 101 and the second metal part 102, which form the housing 110 of the cooler 100 when joined together, define an interior space which serves as the cooling channel 111 of the cooler 100.

A cooling fin arrangement 1 is arranged in the cooling channel 111, which serves as a surface-enlarging, flow-guiding and heat-transfer-enhancing structure for a fluid used as a coolant. For this purpose, the cooling fin arrangement 1 has a plurality of cooling fins 10. The cooling fins 10 are advantageously joined to the first metal part 101 and second metal part 102 by means of the layer 103.

As can be seen from FIGS. 1 through 5, each cooling fin 10 is formed from a wave profile that periodically repeats in a direction of repetition 501. The period with which the wave profiles of the cooling fins 10 repeat is the same for all cooling fins 10. The direction of repetition 501 is perpendicular to a flow direction 500 and corresponds in particular to a width direction of the cooler 100. The flow direction 500 corresponds to a main flow direction of a fluid used as a coolant when it flows through the cooling channel 111, in particular through through openings 14 (FIGS. 1 and 3), which are formed by the cooling fins 10.

In particular, all repeating profiles of the cooling fins 10 have a meandering cross-section. This means that the cooling fins 10 are meander-shaped.

Each cooling fin 10 has legs 15, first connecting webs 16 and second connecting webs 17. The first connecting webs 16 connect two adjacent legs 15 to each other in an upper region of the legs 15, while the second connecting webs 17 connect two adjacent legs 15 to each other in a lower region of the legs 15. The first connecting webs 16 are closer to the power electronics 200 than the second connecting webs 17.

Figure 3:
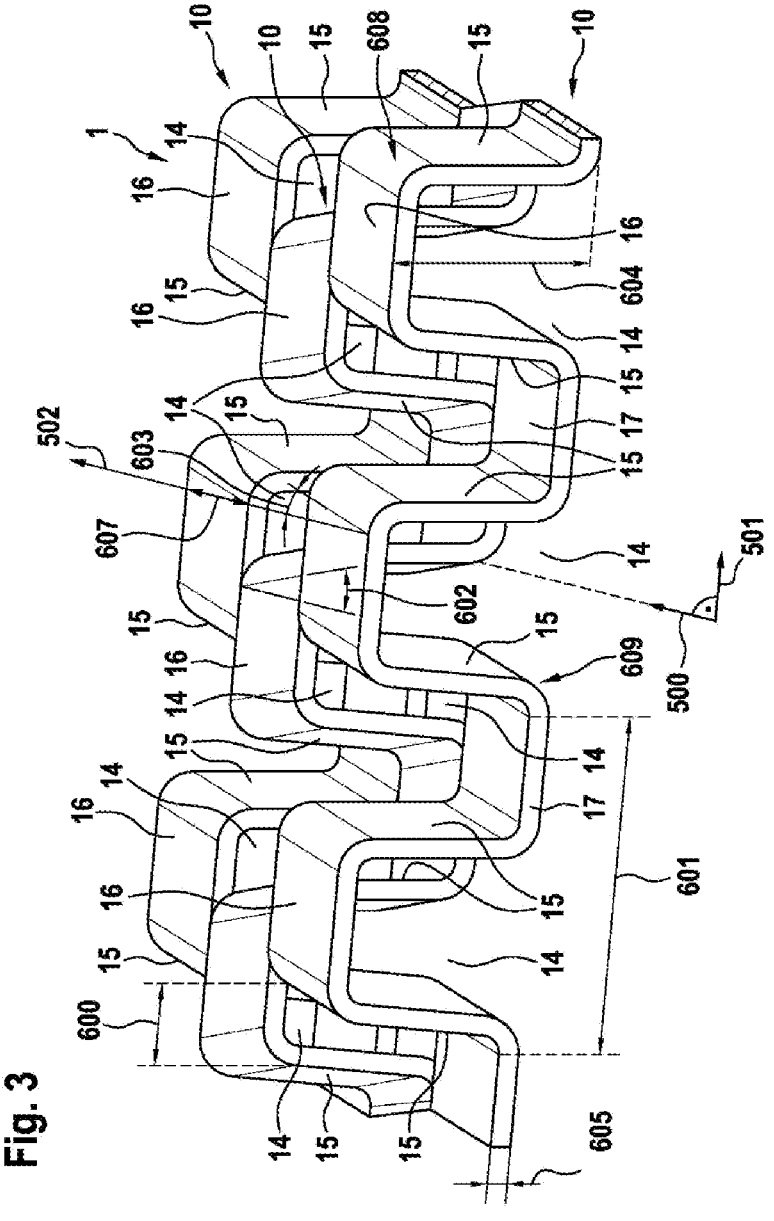

Two adjacent legs 15 merge with a first rounding radius 608 (inner and outer radius) into the corresponding first connecting web 16 and with a second rounding radius 609 (inner and outer radius) into the corresponding second connecting web 17 (FIG. 3). Advantageously, the second rounding radius 609 is larger than the first rounding radius 608, in particular twice as large as the first rounding radius 608.

Figures 4, 5:
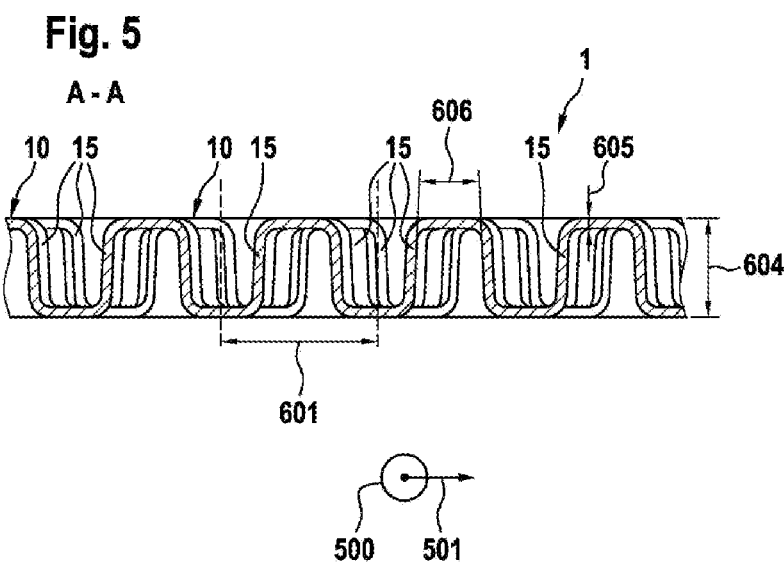

For reasons of clarity, only one cooling fin 10 of the cooling fin arrangement 1 is shown schematically in FIG. 1. FIGS. 2 through 5 illustrate a more detailed design and the relative arrangement of the cooling fins 10. FIG. 4 is a cross-sectional view of the region marked with a dashed line in FIG. 2, taken in the direction of arrows B-B from FIG. 2. FIG. 5 is a cross-sectional view of the region marked with a dashed line in FIG. 2, taken in the direction of arrows A-A.

Figure 2:
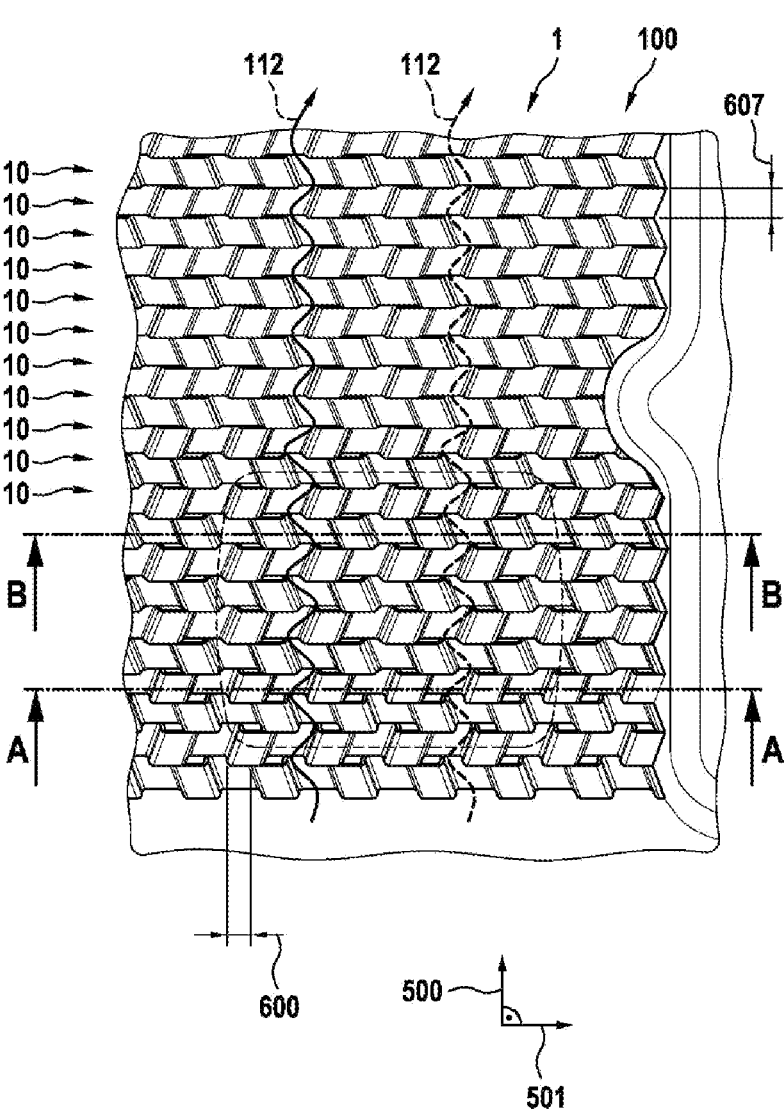

FIGS. 2 and 3 show that the cooling fins 10 are arranged parallel to each other. In particular, the cooling fins 10 form rows that are parallel to each other in the flow direction 500. Furthermore, the cooling fins 10 are arranged offset to one another in the direction of repetition 501. In other words, the repeating wave profile of each cooling fin 10 is offset in the direction of repetition 501 from the repeating wave profile of an adjacent cooling fin 10.

In particular, the cooling fins 10 or the repeating wave profiles of the cooling fins 10 alternately have a first position and a second position in the direction of repetition 501. It should be understood that the first position is the same for the corresponding cooling fins 10. Accordingly, the second position is the same for the relevant cooling fins 10.

An offset 600 between adjacent cooling fins 10 or between the repeating wave profiles of adjacent cooling fins 10 in the direction of repetition, which is shown in FIGS. 2 through 4, is between 0.8×t/4 and 1.2×t/4. The parameter "t" corresponds to a pitch 601 of the cooling fins 10, which is shown in FIGS. 3 and 4. The pitch 601 corresponds to the period with which the wave profiles of the cooling fins 10 are repeated and is between 4 mm and 5 mm, preferably between 4.3 mm and 4.7 mm. It should be noted that the offset 600 corresponds to the offset between the first position and the second position of the cooling fins 10 or their wave profiles.

Furthermore, the legs 15 of the repeating wave profiles of the cooling fins 10 are alternately set at a first angle 602 and a second angle 603 to a direction 502 perpendicular to the direction of repetition 501. The direction 502 perpendicular to the direction of repetition 501 is parallel to the flow direction 500. Thus, the first angle 602 corresponds to a first angle of attack and the second angle 603 corresponds to a second angle of attack. The two angles 602, 603 are shown in FIG. 3.

The first angle 602 is positive and the second angle 603 is negative. This results in a counter-rotating angle of attack. However, it is also possible that all cooling fins 10 are set at an angle to the direction 502 perpendicular to the direction of repetition 501.

The first angle 602 and the second angle 603 have the same amount, which is between 5 degrees and 25 degrees, preferably between 9 degrees and 21 degrees. However, it is also possible that the first angle 602 and the second angle 603 have different amounts.

Furthermore, a height 604 of each cooling fin 10 is between 2.5 mm and 3.5 mm, preferably between 2.9 mm and 3.1 mm. The height 604 is shown in FIGS. 3, 4 and 5.

A profile thickness 605, also referred to as material thickness, of each cooling fin 10 is between 0.2 mm and 0.45 mm, preferably 0.3 mm, wherein a form inclination 606 of each cooling fin is between 3 degrees and 8 degrees. The profile thickness 605 is shown in FIGS. 3, 4 and 5, with the form inclination 606 shown in FIGS. 3 and 4.

A dimension 607 of each cooling fin 10 in the direction 502 perpendicular to the direction of repetition 501 is between 3.1 mm and 4.1 mm, preferably between 3.5 mm and 3.7 mm. Dimension 607 is shown in FIGS. 2 and 3.

Furthermore, the first rounding radius 608 is the same size as a profile thickness 605 of the cooling fins 10, wherein the second rounding radius 609 is twice as large.

In an advantageous way, the cooling fins 10 are alternately designed identically.

Due to the arrangement of the power electronics unit 210 on the cooler 100 and the design of the cooling fin arrangement 1, in particular the cooling fins 10, as well as their relative arrangement as described above, heat generated during operation of the power electronics unit 210 can be efficiently transferred and dissipated from the power electronics unit 210 first to the first metal part 101 and from there to a fluid flowing through the cooling fins 10. The relative arrangement of the cooling fins 10 means that a large number of through-channels with deflection regions are advantageously formed in the cooling channel 111 of the cooler 100. Two such through-channels are shown as examples in FIG. 2 by the dashed arrows 112. As a result, the fluid used as a coolant has to travel a long distance and remains in contact with the legs 15 of the cooling fins 10 for a long time, which leads to increased heat dissipation. In particular, the cooling fins 10 create a turbulent flow of the fluid, which further increases the cooling efficiency of the cooler 100. Furthermore, an optimum ratio between thermal performance and pressure loss is achieved.

The cooling fins 10 are advantageously made of aluminum in order to achieve good heat transfer and at the same time enable simple manufacture. Alternatively, the cooling fins 10 can be provided with an aluminum layer. It is also possible that other thermally conductive materials are used for the cooling fins 10 and/or their layer.

The cooler 100 can also preferably have coolant nozzles, which can also be joined together by means of a hard solder in the manufacturing step of joining the two metal parts 101, 102.

Figure 6:
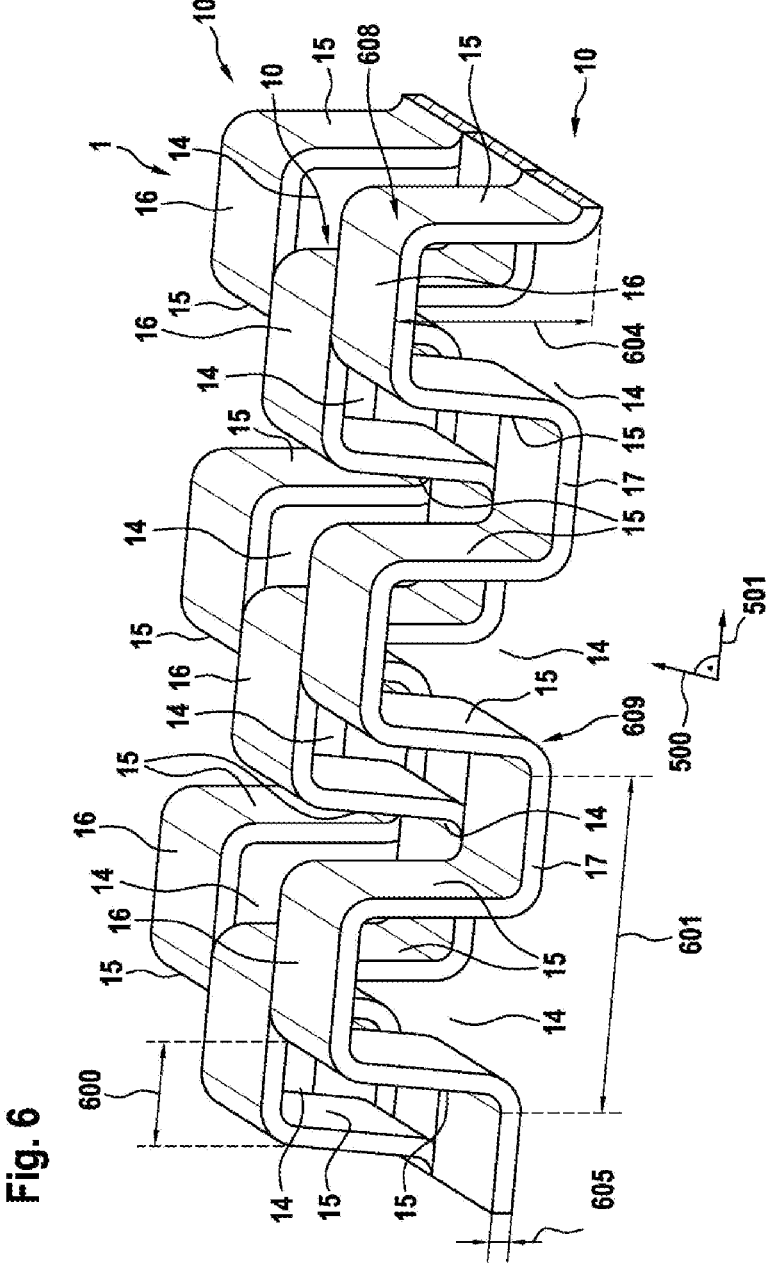

FIG. 6 refers to a power electronics arrangement 1000 according to a second exemplary embodiment of the present invention.

The power electronics arrangement 1000 according to the second exemplary embodiment differs from that of the first exemplary embodiment in the design of the cooling fins 10 of the cooling fin arrangement 1.

FIG. 6 shows that each cooling fin 10 extends perpendicular to the direction of repetition 501. In particular, this means that the legs 15 of the repeating wave profiles of the cooling fins 10 extend parallel to the direction 502. In contrast, in the cooling fin arrangement 1 according to the first exemplary embodiment, the legs 15 of the repeating wave profiles of the cooling fins 10 extend in a direction which is at a first angle 602 or at a second angle 603 to the direction 502.

Another difference is the dimensioning of the cooling fins 10.

In the cooling fin arrangement 1 according to the second exemplary embodiment, the height 604 of each cooling fin 10 is between 2.5 mm and 3.5 mm, preferably between 3 mm and 3.2 mm, the pitch 601 of each cooling fin 10 is between 2 mm and 4 mm, preferably between 2.5 mm and 3.5 mm, and the dimension 607 of each cooling fin 10 in the direction 502 perpendicular to the direction of repetition 501 is between 3.1 mm and 4.1 mm, preferably between 3.5 mm and 3.7 mm.

On the other hand, the profile thickness 605 and the form inclination 606 of each cooling fin 10 in this exemplary embodiment are in the corresponding value ranges that were specified for the cooling fin arrangement 1 in the first exemplary embodiment of the invention. The same also applies to offset 600.

Figure 7:
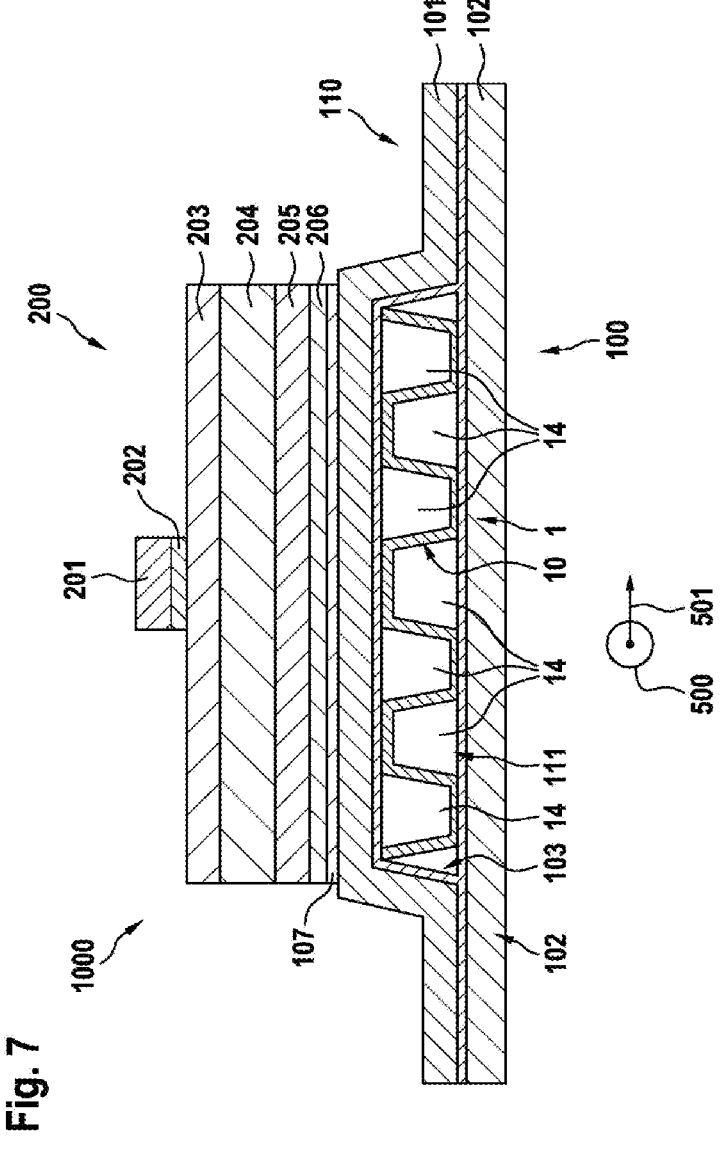

FIG. 7 refers to a power electronics arrangement 1000 according to a third exemplary embodiment of the present invention.

The power electronics arrangement 1000 according to the third exemplary embodiment differs from that according to the first exemplary embodiment in that the first metal part 101, which is the upper part and thus faces the power electronics unit 210, has a plate-shaped region and a trapezoidal region in cross-section, wherein the second metal part 102, which is the lower part and thus faces the power electronics unit 210, is plate-shaped.

This design of the housing 110 can be advantageous in the event of a lack of space in the immediate vicinity of the power electronics unit 210.

It should be noted that the housing 110 of the cooler 100 according to the third exemplary embodiment can also be combined with the cooling fin arrangement 1 according to the second exemplary embodiment.

Figure 8:
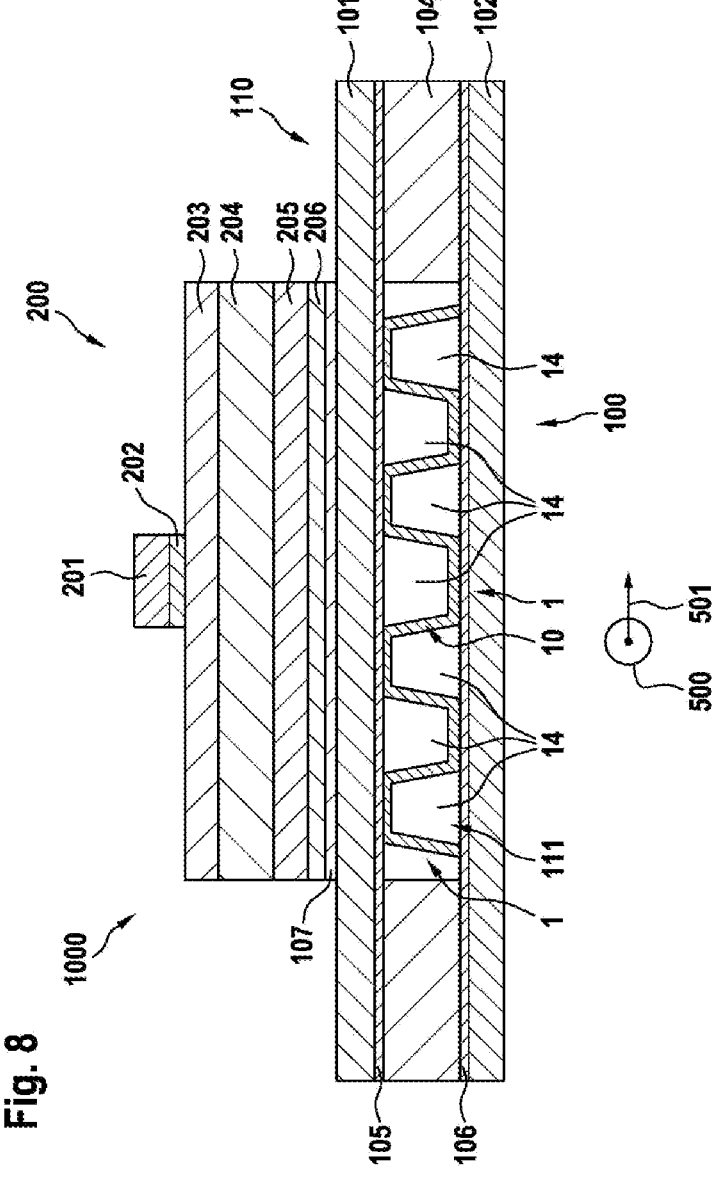

FIG. 8 refers to a power electronics arrangement 1000, according to a fourth exemplary embodiment of the present invention.

Analogous to the power electronics arrangement 1000 according to the third exemplary embodiment, the power electronics arrangement 1000 differs from that according to the first exemplary embodiment in the design of the housing 110 of the cooler 100.

As can be seen from FIG. 8, a third metal part 104 is provided in addition to the first metal part 101 and the second metal part 102, which together with the first metal part 101 and the second metal part 102 form the housing 110 of the cooler 100. The third metal part 104, which in particular is also designed as an aluminum part, is arranged between the first metal part 101 and the second metal part 102. The first metal part 101 is joined to the third metal part 104 by means of a first layer 105, which is connected to the second metal part 102 by means of a second layer 106. The first layer 105 and/or the second layer 106 is/are preferably each formed as a hard solder layer.

It is to be understood that the cooling channel 111 is defined by the first metal part 101, the second metal part 102 and the third metal part 104.

This design of the housing 110 offers the advantage that it can be manufactured very easily.

It should be noted that the housing 110 of the cooler 100 according to the fourth exemplary embodiment can also be combined with the cooling fin arrangement 1 according to the second exemplary embodiment.

Figure 9:
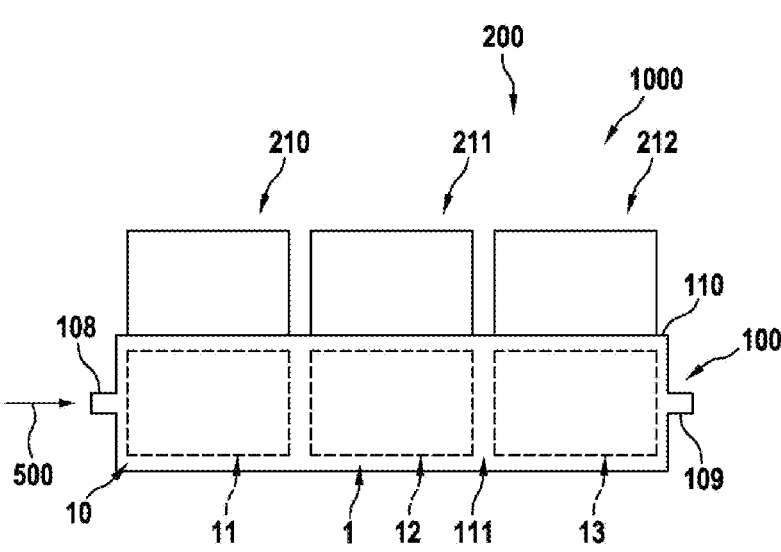

FIG. 9 refers to a power electronics arrangement 1000 according to a fifth exemplary embodiment of the present invention.

The power electronics 200 of the power electronics arrangement 1000 according to the fifth exemplary embodiment comprises a first power electronics unit 210, a second power electronics unit 211 and a third power electronics unit 212. Each of the power electronics units 210, 211, 212 has power semiconductors 201 and can advantageously be designed like the power electronics unit 210 of FIG. 1.

In the flow direction 500 or the main flow direction of the fluid used as coolant, the first power electronics unit 210 is arranged upstream of the second power electronics unit 211, which in turn is arranged upstream of the third power electronics unit 212 in the flow direction 500. The flow direction 500 advantageously corresponds to a direction from an inlet 108 to an outlet 109 of the cooler 100.

The cooling fin arrangement 1 of the cooler 100 has a first group of cooling fins 11, a second group of cooling fins 12 and a third group of cooling fins 13. The first group of cooling fins 11 is assigned to the first power electronics unit 210, the second group of cooling fins 12 to the second power electronics unit 211 and the third group of cooling fins 13 to the third power electronics unit 212.

All cooling fins 10 of the cooling fin arrangement 1 are advantageously formed from a single part (sheet metal). In other words, the cooling fin arrangement 1 is manufactured in one piece. The cooling fin groups 11 through 13 are to be understood as regions of the cooling fin arrangement 1 and not as separate assemblies.

Preferably, the cooling fin groups 11, 12, 13 are designed in such a way that the first cooling fin group 11, the second cooling fin group 11 and the third cooling fin group 13 have the same cooling capacity and, in particular, the same temperature in the respective power semiconductors 201. Thus, it can be ensured that the second power electronics unit 211 and the third power electronics unit 210 are cooled in the same way as the first power electronics unit 210, although the fluid is heated during its flow through the cooling channel 111 and thus it is to be expected that a temperature increases in the direction from the first power electronics unit 210 to the third power electronics unit 212.

For this purpose, the cooling fins 10 of the cooling fin groups 11, 12, 13 are designed differently from one another. It should be noted that the cooling fins 10 of any of the cooler fin groups 11, 12, 13 can be designed like the cooling fins 10 of the cooler arrangements 1 described above. Furthermore, it should be noted that the cooler 100 in this exemplary embodiment can also be designed like the cooler 100 according to the previous exemplary embodiment.

When the cooling fins 10 of the cooling fin groups 11, 12, 13 are formed according to the first exemplary embodiment, an amount of the first angle 602 and/or an amount of the second angle 603 for the first cooling fin group 11 in the flow direction 500 is preferably 10 degrees, for the second cooling fin group 12 in the flow direction 500 is preferably 15 degrees, and for the third cooling fin group 13 in the flow direction 500 is preferably 20 degrees. Except for the first angle 602 and/or the second angle 603, the cooling fins 10 of the cooling fin groups 11, 12, 13 can preferably be of identical design.

The invention claimed is:

1. A cooling fin arrangement (1) of a cooler through which fluid can flow for cooling power electronics (200), the cooling fin arrangement (1) comprising at least one cooling fin (10) which is formed from a wave profile that periodically repeats in a direction of repetition (501), the direction of repetition (501) being perpendicular to a flow direction (500), wherein the at least one cooling fin (10) comprises a plurality of cooling fins (10) which are formed from wave profiles repeating periodically in a direction of repetition (501) and are arranged next to each other, wherein a region of the wave profile of a cooling fin (10) of the plurality of cooling fins (10) is set at a first angle (602) relative to a direction (502) perpendicular to the direction of repetition (501) and a region of the wave profile of another cooling fin (10) of the plurality of cooling fins (10) is set at a second angle (603) relative to the direction (502) perpendicular to the direction of repetition (501), the second angle (603) being different from the first angle (602).

2. The cooling fin arrangement (1) according to claim 1, wherein the wave profile repeats an integer or non-integer number of times.

3. The cooling fin arrangement (1) according to claim 1, wherein a cross-section of the at least one cooling fin (10) has a shape of a meander.

4. The cooling fin arrangement (1) according to claim 1, wherein the wave profile of a cooling fin (10) of the plurality of cooling fins (10) is arranged offset in the direction of repetition (501) from the wave profile of an adjacent cooling fin (10) of the plurality of cooling fins (10).

5. The cooling fin arrangement (1) according to claim 1, wherein:

a height (604) of a cooling fin (10) of the plurality of cooling fins (10) is between 2.5 mm and 3.5 mm, and/or a pitch (601) of the cooling fin (10) is between 4 mm and 5 mm and/or a dimension (607) of the cooling fin (10) in a direction (502) perpendicular to the direction of repetition (501) is between 1.5 mm and 2.1 mm and/or a profile thickness (605) of the cooling fin (10) is between 0.2 mm and 0.45 mm and/or a form inclination (606) of the cooling fin (10) is between 3 degrees and 8 degrees.

6. The cooling fin arrangement (1) according to claim 1, wherein the plurality of cooling fins (10) of the cooling fin arrangement (1) comprises at least a first cooling fin group (11) for cooling a first power electronics unit (210) and a second cooling fin group (12) for cooling a second power electronics unit (211), the first cooling fin group (11) and the second cooling fin group (12) configured such that a temperature of at least one power semiconductor (201) of the first power electronics unit (210) assigned to the first cooling fin group (11) is equal to a temperature of at least one power semiconductor (201) of the second power electronics unit (211) assigned to the second cooling fin group (12).

7. The cooling fin arrangement (1) according to claim 6, wherein the plurality of cooling fins (10) of the cooling fin arrangement (1) further comprises a third cooling fin group (13), and wherein for the first cooling fin group (11) in the flow direction (500), an amount of the first angle (602) and/or an amount of the second angle (603) is 10 degrees, for the second cooling fin group (12) in the flow direction (500), an amount of the first angle (602) and/or an amount of the second angle (603) is 15 degrees, and for the third cooling fin group (13) in the flow direction (500), an amount of the first angle (602) and/or an amount of the second angle (603) is 20 degrees.

8. The cooling fin arrangement (1) according to claim 1, wherein the at least one cooling fin (10) extends perpendicular to the direction of repetition (501).

9. A cooler (100) through which fluid can flow, for cooling power electronics (200), comprising a cooling fin arrangement (1) according to claim 1.

10. The cooler (100) through which fluid can flow according to claim 9, wherein the plurality of cooling fins (10) of the cooling fin arrangement (1) comprises at least a first cooling fin group (11) for cooling a first power electronics unit (210) and a second cooling fin group (12) for cooling a second power electronics unit (211), the first cooling fin group (11) and the second cooling fin group (12) being configured such that a temperature of at least one power semiconductor (201) of the first power electronics unit (210) assigned to the first cooling fin group (11) is equal to a temperature of at least one power semiconductor (201) of the second power electronics unit (211) assigned to the second cooling fin group (12).

11. The cooler (100) through which fluid can flow, according to claim 10, wherein all cooling fins (10) of the cooling fin arrangement (1) are formed from a single part.

12. A power electronics arrangement (1000), which comprises a cooler (100) through which fluid can flow according to claim 9 and power electronics (200), the power electronics (200) being arranged on the cooler (100) through which fluid can flow.

13. The cooling fin arrangement (1) according to claim 4, wherein the wave profiles of the plurality of cooling fins (10) alternately have a first position in the direction of repetition (501) and a second position in the direction of repetition (501), and/or wherein an offset (600) between the wave profiles of adjacent cooling fins (10) of the plurality of cooling fins (10) in the direction of repetition (501) is between 0.8×t/4 and 1.2×t/4, where t is a pitch (601) of the plurality of cooling fins (10).

14. The cooling fin arrangement (1) according to claim 1, wherein the wave profiles of the plurality of cooling fins (10) is set alternately at the first angle (602) and the second angle (603) to a direction (502) perpendicular to the direction of repetition (501), wherein the first angle (602) is positive and the second angle (603) is negative.

15. The cooling fin arrangement (1) according to claim 14, wherein the first angle (602) and the second angle (603) have a common magnitude and/or wherein a magnitude of the first angle (602) and/or a magnitude of the second angle (603) is/are between 5 degrees and 25 degrees.

16. The cooling fin arrangement (1) according to claim 8, wherein:

a height (604) of a cooling fin (10) of the plurality of cooling fins (10) is between 2.5 mm and 3.5 mm, and/or a pitch (601) of the cooling fin (10) is between 2 mm and 4 mm, and/or a dimension (607) of the cooling fin (10) in a direction (502) perpendicular to the direction of repetition (501) is between 3.1 mm and 4.1 mm and/or a profile thickness (605) of the cooling fin (10) is between 0.2 mm and 0.45 mm, and/or a form inclination (606) of the cooling fin (10) is between 3 degrees and 8 degrees.

* * * * *